United States Patent
Chen

[11] Patent Number: 6,083,764
[45] Date of Patent: Jul. 4, 2000

[54] METHOD OF FABRICATING AN MTJ WITH LOW AREAL RESISTANCE

[75] Inventor: Eugene Chen, Gilbert, Ariz.

[73] Assignee: Motorola, Inc., Schaumburg, Ill.

[21] Appl. No.: 09/119,326

[22] Filed: Jul. 20, 1998

[51] Int. Cl.⁷ .................................................. H01L 21/00
[52] U.S. Cl. ................................................. 438/3; 257/295
[58] Field of Search .................................. 438/3; 257/295; 427/127, 129

[56] References Cited

U.S. PATENT DOCUMENTS

| | | | |
|---|---|---|---|
| 5,587,943 | 12/1996 | Tork et al. | 365/158 |
| 5,640,343 | 6/1997 | Gallagher et al. | 365/171 |
| 5,715,121 | 2/1998 | Sakakima et al. | 360/113 |
| 5,729,410 | 3/1998 | Fontana, Jr. et al. | 360/113 |
| 5,757,056 | 5/1998 | Chui | 257/421 |
| 5,764,567 | 6/1998 | Parkin | 365/173 |
| 5,932,343 | 8/1999 | Hayashi et al. | 428/332 |
| 5,948,553 | 9/1999 | Kamijo | 428/692 |

FOREIGN PATENT DOCUMENTS

| | | | |
|---|---|---|---|
| 1974409 | 4/1999 | Germany | G11C 11/14 |
| 9199769 | 7/1997 | Japan | H01L 43/08 |
| 9306733 | 11/1997 | Japan | H01F 10/08 |

*Primary Examiner*—Charles Bowers
*Assistant Examiner*—Evan Pert
*Attorney, Agent, or Firm*—Eugene A. Parsons; William A. Koch

[57] ABSTRACT

A method of fabricating a magnetoresistive tunnel junction including forming a thin, continuous layer of aluminum alloy on the surface of a first magnetic layer, the continuous layer of aluminum alloy including greater than 90% aluminum and traces of materials having atoms that are different from the atoms of the aluminum to produce grains which are smaller than grains of pure aluminum. The continuous layer of aluminum alloy is oxidized, nitridized, or both to produce a continuous layer of non-conductive material and a second magnetic layer is formed on the layer of non-conductive material.

12 Claims, 1 Drawing Sheet

METHOD OF FABRICATING AN MTJ WITH LOW AREAL RESISTANCE

FIELD OF THE INVENTION

The present invention pertains to methods of fabricating magnetoresistive tunneling junctions for memory cells and more specifically to methods of manufacturing magnetoresistive tunneling junctions with low areal resistance.

BACKGROUND OF THE INVENTION

A magnetic random access memory (MRAM) is a non-volatile memory which basically includes a giant magnetoresistive (GMR) material or magnetic tunneling junction (MTJ) structure, a sense line, and a word line. The MRAM employs the magnetic vectors to store memory states. Magnetic vectors in one or all of the layers of GMR material or MTJ are switched very quickly from one direction to an opposite direction when a magnetic field is applied to the GMR material or MTJ over a certain threshold. According to the direction of the magnetic vectors in the GMR material or MTJ, states are stored, for example, one direction can be defined as a logic "0", and another direction can be defined as a logic "1". The GMR material or MTJ maintains these states even without a magnetic field being applied. The states stored in the GMR material or MTJ can be read by passing a sense current through the cell in a sense line because of the difference between the resistances of the two states.

Magnetic tunneling junction (MTJ) structure or cells include at least a pair of magnetic layers with a non-magnetic, non-conducting tunnel layer sandwiched therebetween. When a sense voltage is applied between the pair of magnetic layers, electrical carriers travel between the pair of magnetic layers by tunneling through the non-magnetic, non-conducting tunnel layer sandwiched between the magnetic layers. The resistance to the sense current is a maximum when the magnetic vectors of the pair of magnetic layers are anti-parallel and minimum when the magnetic vectors of the pair of magnetic layers are parallel. The difference between the maximum and minimum resistance is commonly referred to as the magnetoresistance (MR) ratio.

Further, the minimum resistance of the MTJ cell (commonly referred to as the areal resistance) is determined by the construction and materials of the MTJ cell. Clearly, in an ideal MTJ cell the areal resistance would be very low or zero and the maximum resistance would be very high or infinite, similar to an ideal switch. Prior art attempts to reduce the areal resistance include depositing a layer of pure aluminum on the lower magnetic layer and then oxidizing the aluminum layer in oxygen plasma. A problem with this procedure is that as the aluminum layer is deposited, pinholes tend to form, especially if the layer is thin. As the aluminum is oxidized, some of the pinholes tend to remain and produce shorts in the MTJ cell when the second magnetic layer is deposited on the aluminum oxide layer. To overcome the pinhole problem, one possible solution is to deposit the aluminum layer at low temperatures (e.g. the temperature of liquid nitrogen) for reducing the size of the grains. Some of the problems with this method are that it involves extensive heating and cooling cycles, takes a long time, costs more and hence is not a method which can be used in manufacturing.

Accordingly, it would be highly advantageous if MTJ cells could be fabricated at room temperature without the problem of pinholes and the like.

It is a purpose of the present invention to provide a new and improved method of fabricating MTJ cells with reduced areal resistance.

It is another purpose of the present invention to provide a new and improved method of fabricating MTJ cells with high quality barriers or tunnel layers.

It is a still another purpose of the present invention to provide a new and improved method of fabricating MTJ cells with high magnetoresistance ratios.

It is a further purpose of the present invention to provide a new and improved method of fabricating MTJ cells with thinner and continuous metal layers for the formation of the barrier or tunnel layer.

It is still a further purpose of the present invention to provide a new and improved method of fabricating MTJ cells which does not require extensive cooling and heating cycles and which is easily adaptable to manufacturing.

SUMMARY OF THE INVENTION

The above problems and others are at least partially solved and the above purposes and others are realized in a method of fabricating a magnetoresistive tunnel junction including forming a continuous layer of material on the surface of a first magnetic layer, the layer of material including a dominant material and traces of materials having atoms that are different from the atoms of the dominant material to produce grains which are smaller than grains of the dominant material alone. The continuous layer of material is then oxidized, nitridized, or some combination of the two to produce a layer of non-conductive material and a second magnetic layer is formed on the layer of non-conductive material.

BRIEF DESCRIPTION OF THE DRAWINGS

Referring to the drawings.

DESCRIPTION OF THE PREFERRED EMBODIMENT

Figure 1:
FIG. 1 through FIG. 4 are simplified and enlarged sectional views illustrating various intermediate structures in accordance with the present invention.

Turning now to the drawings in which like characters are designated with similar numbers throughout, FIG. 1 illustrates a structure including a supporting substrate 10 with a magnetic layer 11 formed thereon. While supporting substrate 10 is illustrated as a single layer for simplicity, it will be understood by those skilled in the art that it may include additional layers for various purposes, such as buffer layers, insulating or conducting layers, etc., and all such layers are considered as included in supporting substrate 10. Magnetic layer 11 has an upper surface 12 which is formed as smooth as possible for the deposition of further layers thereon. Magnetic layer 11 is formed of any of the various materials, or multiple layers of materials, well known in the art and will not be described in great detail herein.

While the magnetic cell or cells described herein are illustrated in sectional views for convenience, it should be understood that the figures represent a portion of a cell or an array of cells and each cell can be rectangularly shaped or circular, square or diamond shaped, or elliptical, if desired. As is known in the art, cells that are rectangularly shaped have magnetization vectors that are positioned substantially along the length of the cell and maintained parallel to the length by the physical anisotropy. To achieve this, the width of the cell is formed to be smaller than the width of the magnetic domain walls or transition width within the magnetic layers. Typically, widths of less than 1.0 to 1.2 microns result in such a constraint. Generally, to achieve high density the width is less than one micron and is as small as can be made by manufacturing technology, and the length is greater than the width. Also, thicknesses of the magnetic layers, e.g. layer 11, are approximately three to ten nanometers and may be different for each magnetic layer in some embodiments. The difference in thicknesses affect the switching points and are utilized in some structures for reading and writing cells.

When the aspect ratio (length to width) of a single magnetic layer is close to one, such as for circular, square or diamond shaped, or elliptical shaped cells, the switching field from shape anisotropy is minimum. In the case of circularly shaped cells, for example, the preferred magnetization direction is determined by uniaxial crystal field anisotropy (or magnetic crystalline anisotropy). This preferred magnetization direction is set during film deposition by a bias field or by annealing the film after deposition in a high magnetic field (e.g. several kOe) at elevated temperatures (e.g. 200° C. to 300° C.). In the case of a square or diamond shape, for example, the uniaxial crystal anisotropy is set along a diagonal direction of the square. In the case of an elliptically shaped cell, the uniaxial crystal anisotropy is set along the long axis of the cell. The main idea is to minimize the shape effect, which contributes to the rise in required switching fields at narrow cell widths, and to utilize crystal field anisotropy to set the preferred magnetization direction needed by a memory cell.

Figure 2:
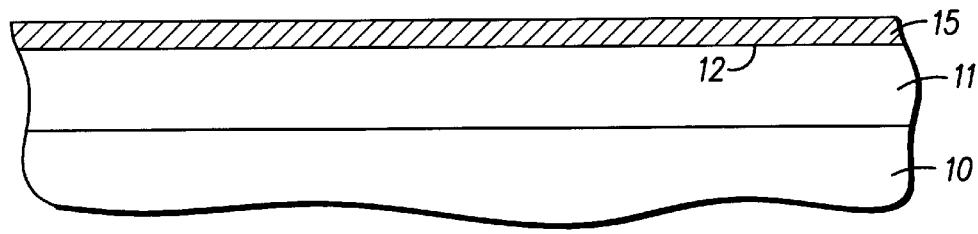

Referring now to FIG. 2, a continuous layer 15 of metal is formed on surface 12 of magnetic layer 11. For purposes of this disclosure the term "continuous" refers to a layer of material which is approximately coextensive with magnetic layer 11 and which does not include any pinholes or the like. Layer 15 includes a dominant material or element, which can be easily oxidized, nitridized, or some combination of the two, and traces of one or more other materials or elements having atoms that are different from the atoms of the dominant metal. Generally, the amount of the dominant element will be greater than 90% including only an amount sufficient to produce grains in layer 15 which are smaller than grains of the dominant element alone so as to produce a continuous layer. In a preferred embodiment, the dominant element is aluminum and the trace materials can be any or all of Cu, Si, Ta, Ti, or the like.

In one specific technique a dominant metal and a trace metal or metals are deposited simultaneously so as to arrive at a mixture that results in the smaller grains and, thus, the continuous layer. In a second technique, seed material is deposited on surface 12 of magnetic layer 11 by any convenient method. The seed material may or may not be a continuous layer. The dominant material is then formed with the use of the seed material, the presence of the seed material insuring a substantially thinner continuous layer of the dominant material. In a preferred embodiment, the seed material includes one or more of Cu, Si, Ta, Ti, or the like and the dominant material includes aluminum.

In either of the above techniques, layer 15 is continuous with no pinholes or the like and with a thickness in a range of approximately 0.3 nm to 3 nm and preferably approximately 1.5 nm. It has been found, for example, that the minimum thickness of a continuous aluminum layer 15 for producing a quality barrier layer is approximately 1.5 nm, with thinner continuous aluminum layers resulting in a reduced MR ratio. However, in instances where a dominant material other than aluminum is used, the thinnest continuous layer possible without a reduction in the MR ratio may be different. The addition of a trace material in aluminum can also lower its tunneling energy barrier and, hence, lower the resistance of the MTJ.

Figure 3:
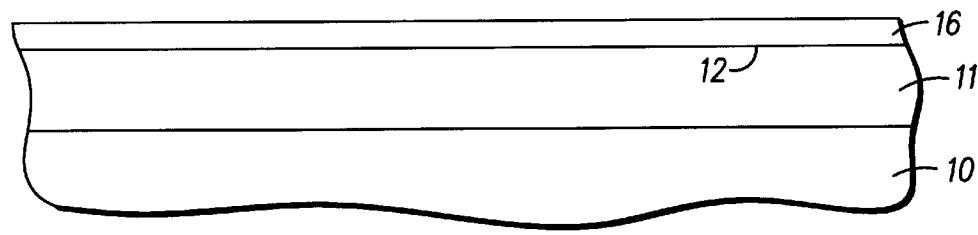

Once continuous layer 15 is in place, a treating step is performed to produce a barrier or tunnel layer 16, as illustrated in FIG. 3, of treated non-conductive material. The treatment may include, for example, plasma oxidation, nitridation, or both. Generally, continuous layer 15 can be made very thin while still maintaining its integrity, which results in a very thin barrier or tunnel layer 16 and, consequently, a substantially reduced areal resistance. Further, the fact that layer 15 is continuous substantially improves the quality and reliability of barrier or tunnel layer 16.

Figure 4:
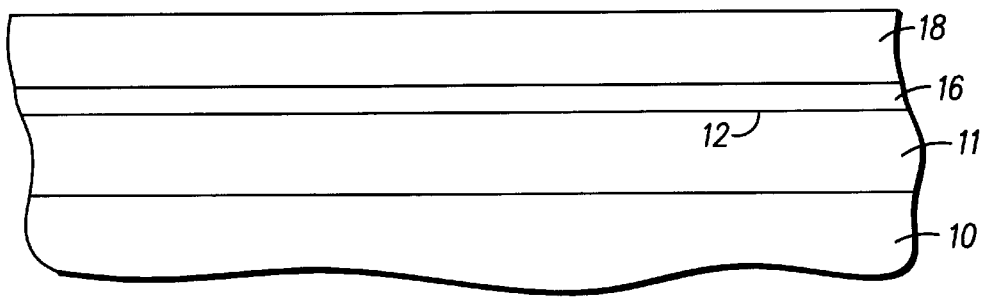

Referring to FIG. 4, a magnetic layer 18 is deposited over barrier or tunnel layer 16 and any electrical connections, passivation, etc. (not shown) are performed to provide a complete cell 20 and/or an array of cells. Generally, the thicknesses of magnetic layer 18 is approximately three to ten nanometers and may be different than or the same as magnetic layer 11 in different embodiments. As explained above, the difference in thicknesses of the magnetic layers affect the switching points and are utilized in some structures for the functions of reading and writing the cells.

In a specific example, layer 11 is formed of cobalt (Co) approximately 100 Å thick (generally in a range of 10 Å to 200 Å), layer 16 is formed of aluminum oxide ($Al_2O_3$) approximately 25 Å thick (generally in a range of 10 Å to 100 Å), and magnetic layer 18 is formed of nickel iron (NiFe) approximately 100 Å thick (generally in a range of 10 Å to 200 Å). The change of resistance versus the resistance ($\Delta R/R$) is generally in a range of 10% to 30%. Thus, the state of magnetic cell 20 is relatively easily sensed by passing a sense current therethrough from magnetic layer 11 to magnetic layer 18 (or vice versa). The change of resistance in cell 20 is easily read as a change in voltage drop across cell 20 which can conveniently be used in conjunction with memory arrays and the like.

Thus, a new and improved method of fabricating MTJ cells with reduced areal resistance has been disclosed. The new and improved method provides the fabrication of MTJ cells with high quality barriers or tunnel layers and with high magnetoresistance ratios. The new and improved method provides for the fabrication of thinner and continuous metal layers for the formation of the barrier or tunnel layer in MTJ cells is easily adaptable to manufacturing processes.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A method of fabricating a magnetoresistive tunnel junction comprising the steps of:

providing a first magnetic layer of material with a surface;

forming a continuous layer of material on the surface of the first magnetic layer, the layer of material including a dominant material having atoms and traces of materials having atoms that are different from the atoms of the dominant material;

treating the continuous layer of material to produce a layer consisting of treated non-conductive material; and forming a second magnetic layer on the layer of treated non-conductive material.

2. A method of fabricating a magnetoresistive tunnel junction as claimed in claim 1 wherein the step of forming the continuous layer of material including the dominant material includes forming a continuous layer of aluminum.

3. A method of fabricating a magnetoresistive tunnel junction as claimed in claim 2 wherein the step of forming the continuous layer of material including traces of materials includes forming a continuous layer of aluminum with traces of one of Cu, Si, Ta, or Ti.

4. A method of fabricating a magnetoresistive tunnel junction as claimed in claim 1 wherein the step of forming the continuous layer of material includes forming the layer with a thickness in a range of 0.3 nm to 3 nm.

5. A method of fabricating a magnetoresistive tunnel junction as claimed in claim 4 wherein the step of forming the continuous layer of material includes forming the layer with a thickness of approximately 1.5 nm.

6. A method of fabricating a magnetoresistive tunnel junction as claimed in claim 1 wherein the step of forming the continuous layer of material including the dominant material having atoms and traces of materials having atoms that are different from the atoms of the dominant material includes the steps of depositing on the surface of the first magnetic layer a seed material having atoms that are different from the atoms of the dominant material and depositing the dominant material on the seed material.

7. A method of fabricating a magnetoresistive tunnel junction as claimed in claim 1 wherein the step of forming the continuous layer of material including the dominant material includes forming the continuous layer with greater than 90% dominant material.

8. A method of fabricating a magnetoresistive tunnel junction as claimed in claim 1 wherein the step of treating the continuous layer of material includes one of oxidizing, nitridizing, or a combination thereof.

9. A method of fabricating a magnetoresistive tunnel junction comprising the steps of:

providing a first magnetic layer of material with a surface;

forming a continuous layer of aluminum alloy on the surface of the first magnetic layer with a thickness in a range of 1 nm to 3 nm, the layer of aluminum alloy including greater than 90% aluminum having atoms and traces of materials having atoms that are different from the atoms of the aluminum to produce grains which are smaller than grains of the aluminum alone;

oxidizing the continuous layer of aluminum alloy to produce a layer of oxidized aluminum alloy; and forming a second magnetic layer on the layer of oxidized aluminum alloy.

10. A method of fabricating a magnetoresistive tunnel junction as claimed in claim 9 wherein the step of forming the continuous layer of metal including traces of materials includes forming a continuous layer of aluminum with traces of one of Cu, Si, Ta, or Ti.

11. A method of fabricating a magnetoresistive tunnel junction as claimed in claim 9 wherein the step of forming the continuous layer of metal includes forming the layer with a thickness of approximately 1.5 nm.

12. A method of fabricating a magnetoresistive tunnel junction as claimed in claim 9 wherein the step of forming the continuous layer of metal including the dominant oxidizable metal having atoms and traces of materials having atoms that are different from the atoms of the oxidizable metal includes the steps of depositing on the surface of the first magnetic layer a seed material having atoms that are different from the atoms of the oxidizable metal and depositing the dominant oxidizable metal on the seed material.

* * * * *

UNITED STATES PATENT AND TRADEMARK OFFICE
CERTIFICATE OF CORRECTION

PATENT NO.   : 6,083,764
DATED        : July 4, 2000
INVENTOR(S)  : Chen

It is certified that error appears in the above-identified patent and that said Letters Patent is hereby corrected as shown below:

Column 1,
Line 3, after the Title, please add as a new first paragraph the following paragraph:
-- This invention was made with Government support under Agreement No. MDA972-96-3-0016 awarded by DARPA. The Government has certain rights in the invention. --

Signed and Sealed this

Nineteenth Day of August, 2003

JAMES E. ROGAN
*Director of the United States Patent and Trademark Office*